US011686801B2

(12) United States Patent
Kurokawa et al.

(10) Patent No.: US 11,686,801 B2
(45) Date of Patent: Jun. 27, 2023

(54) MAGNETIC RESONANCE IMAGING DEVICE AND SENSITIVITY DISTRIBUTION CALCULATION PROGRAM

(71) Applicant: FUJIFILM Healthcare Corporation, Kashiwa (JP)

(72) Inventors: Shinji Kurokawa, Chiba (JP); Yasuhiro Kamada, Chiba (JP); Toru Shirai, Chiba (JP); Takenori Murase, Chiba (JP); Hiroki Shoji, Chiba (JP)

(73) Assignee: FUJIFILM Healthcare Corporation, Kashiwa (JP)

( * ) Notice: Subject to any disclaimer, the term of this patent is extended or adjusted under 35 U.S.C. 154(b) by 0 days.

(21) Appl. No.: 17/731,412

(22) Filed: Apr. 28, 2022

(65) Prior Publication Data

US 2022/0373629 A1 Nov. 24, 2022

(30) Foreign Application Priority Data

May 20, 2021 (JP) ................................. 2021-085645

(51) Int. Cl.
*G01R 33/56* (2006.01)
(52) U.S. Cl.
CPC ................................ *G01R 33/5608* (2013.01)
(58) Field of Classification Search
CPC .................................................. G01R 33/5608
See application file for complete search history.

(56) References Cited

U.S. PATENT DOCUMENTS

| 7,224,163 | B2 * | 5/2007 | Takizawa | G01R 33/5611 |
| | | | | 324/318 |
| 8,488,860 | B2 * | 7/2013 | Uchizono | G01R 33/565 |
| | | | | 382/131 |
| 9,157,978 | B2 * | 10/2015 | Nonaka | G01R 33/3664 |
| 10,353,023 | B2 | 7/2019 | Nielsen | |

FOREIGN PATENT DOCUMENTS

JP 6820876 1/2021

OTHER PUBLICATIONS

Klaas P. Pruessmann, et al. Magnetic Resonance in Medicine 42: 952-962 (1999).
Mark A. Griswold, et al. Magnetic Resonance in Medicine 47: 1202-1210 (2002).

* cited by examiner

*Primary Examiner* — Gregory H Curran
(74) *Attorney, Agent, or Firm* — Paul Teng

(57) ABSTRACT

During obtaining a sensitivity distribution in a k-space, data based on which the sensitivity distribution is obtained is expanded with a mirror image to create an expanded image to prevent spectrum leakage, and the sensitivity distribution is stably calculated. During obtaining the sensitivity distribution in the k-space, image data based on which the sensitivity distribution is obtained is inverted as a mirror image to be made into the expanded image, the expanded image is transformed into k-space data, and a frequency component (frequency space data) of the sensitivity distribution is calculated. A region corresponding to the original image data is clipped from the calculated frequency space data, and the sensitivity distribution is obtained.

14 Claims, 16 Drawing Sheets

MAGNETIC RESONANCE IMAGING DEVICE AND SENSITIVITY DISTRIBUTION CALCULATION PROGRAM

BACKGROUND OF THE INVENTION

Field of the Invention

The present invention relates to a magnetic resonance imaging device (hereinafter, referred to as an MRI device), and particularly to a technique for calculating a sensitivity distribution in a k-space.

Description of the Related Art

A technique is provided in which data is undersampled and received by a receiving coil including a plurality of channels, and an image is reconstructed using information on a sensitivity distribution of the coil (Klaas P. Pruessmann, et al. Magnetic Resonance in Medicine 42: 952-962 (1999) (Non-Patent Literature 1) and Mark A. Griswold, et al. Magnetic Resonance in Medicine 47: 1202-1210 (2002) (Non-Patent Literature 2)). In order to perform this image reconstruction, it is necessary to accurately calculate the sensitivity distribution of the coil. However, it may be difficult to accurately calculate a boundary portion of a subject or the like. This is because, for stable reconstruction, it is necessary to calculate the sensitivity distribution such that the sensitivity distribution is slightly extrapolated even in a region where the subject is not present, but the extrapolation is difficult, and because, at the boundary of the subject, received data which is a source of the sensitivity calculation becomes small, SNR becomes low, and an error becomes large. In order to solve this problem, a technique for obtaining a sensitivity distribution in a k-space (frequency domain) is provided (Japanese Patent No. 6820876 (Patent Literature 1) and U.S. patent Ser. No. 10/353,023 (Patent Literature 2)).

In calculation of finding the sensitivity distribution in the k-space, the sensitivity is obtained by deconvoluting, in the k-space, a frequency component of the sensitivity distribution convoluted into a reference image in the k-space using an image of each channel and an image (a reference image) that does not depend on the sensitivity distribution. In such calculation in the k-space, a sensitivity distribution in a boundary region where a signal is weak is obtained using a surrounding region where the signal is strong, and it is possible to prevent the sensitivity distribution from being extremely inaccurate in the boundary region. Based on assumption that the sensitivity distribution does not change greatly, a size of a kernel obtained by the deconvolution can be reduced, a large change can be limited, and a natural sensitivity distribution can be stably obtained.

SUMMARY OF THE INVENTION

In techniques as disclosed in Patent Literature 1 and Patent Literature 2 in which a sensitivity distribution is obtained by executing calculation in the k-space, a measure against spectrum leakage is required. If the measure against the spectrum leakage is insufficient, the sensitivity distribution becomes unstable, for example, the sensitivity distribution oscillates in a region where the signal is weak. In order to reduce an influence of the spectrum leakage, a method is provided in which data for calculating the sensitivity distribution is zero-filled in an image space and enlarged so as to be a predetermined FOV. However, when the FOV is enlarged by zero fill, a degree of freedom of a solution may be increased, and the oscillation may be large in a no-signal region.

The oscillation is prevented by reducing a kernel size in convolution. However, when the kernel size is reduced, a frequency that can be handled may become narrow and it may not be possible to express a high frequency in the sensitivity distribution.

In order to solve the above-mentioned problem, the invention is to calculate a sensitivity distribution using data which is created by expanding original data used for calculation of the sensitivity distribution, with a mirror image, while preventing spectrum leakage.

That is, an MRI device according to the invention includes: a measurement unit that is provided with a receiving coil having a plurality of channels and is configured to measure a nuclear magnetic resonance signal of a subject for each channel of the receiving coil; and an image calculation unit configured to create an image of the subject using a sensitivity distribution for each channel of the receiving coil and a channel image generated based on the nuclear magnetic resonance signal for each channel measured by the measurement unit. The image calculation unit includes a sensitivity distribution calculation unit configured to calculate a sensitivity distribution for each channel of the receiving coil in a k-space using a image obtained for sensitivity distribution. The sensitivity distribution calculation unit includes an expanded image creation unit configured to generate, by executing one or more inversion processes on at least a part of the image for obtaining sensitivity distribution, an expanded image obtained by combining a generated inverted image and the original image for obtaining sensitivity distribution, and calculates the sensitivity distribution using the expanded image.

In the invention, the "sensitivity distribution" includes not only sensitivity distributions in the image space and the k-space (a frequency space) but also information corresponding to a sensitivity distribution such as a weight coefficient in the k-space that is used in an image reconstruction method (a GRAPPA method) in Non-Patent Literature 2, and the invention can also be applied during obtaining such sensitivity distribution information.

According to the invention, during obtaining the sensitivity distribution in the k-space, the sensitivity distribution can be obtained more stably. The kernel size can be increased and a high frequency component of the sensitivity distribution can be expressed while ensuring that the sensitivity distribution is stably obtained.

DESCRIPTION OF EMBODIMENTS

First, an embodiment of an MRI device common to each of later-described embodiments of the invention will be described.

Figure 1:
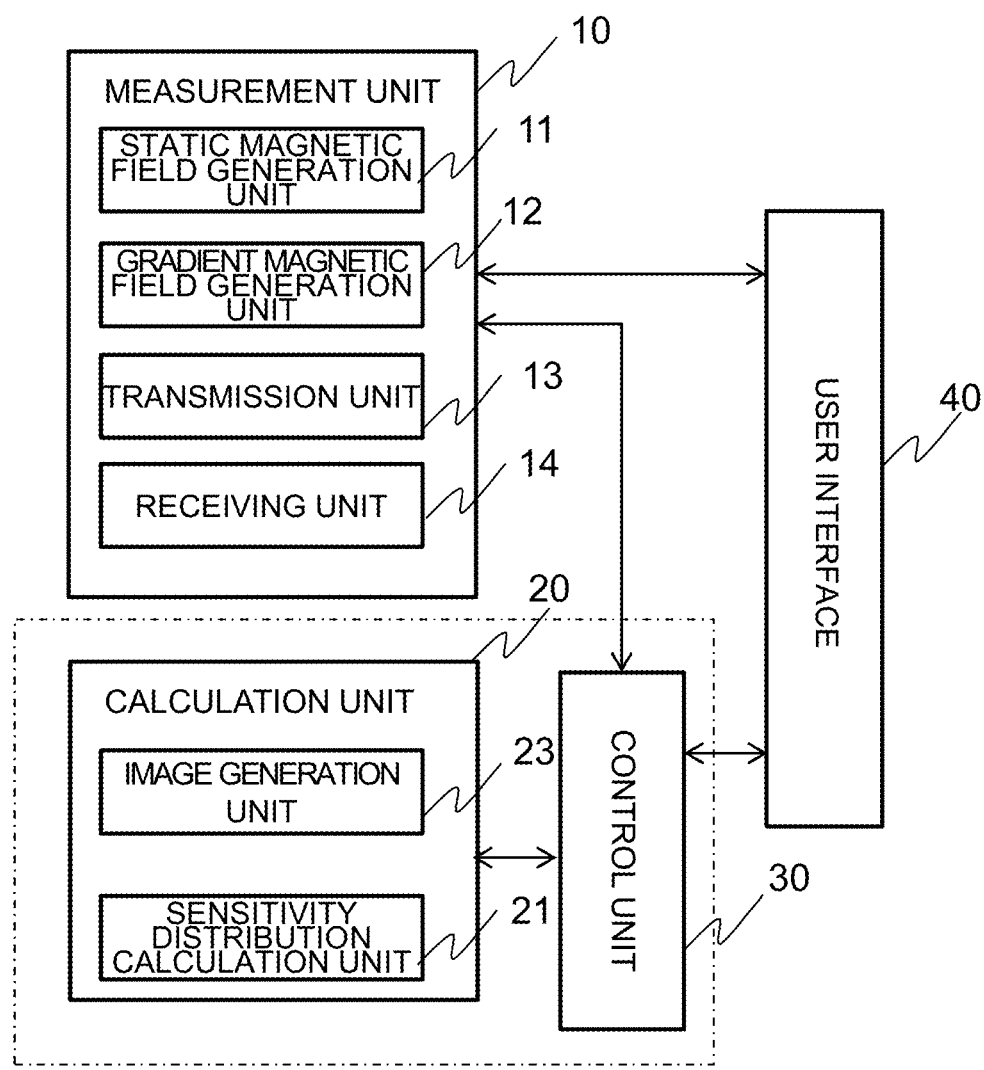
FIG. 1 is a functional block diagram of an MRI device.

As illustrated in FIG. 1, the MRI device according to the present embodiment includes: a measurement unit 10 that acquires a nuclear magnetic resonance signal; a calculation unit (an image calculation unit) 20 that executes calculation such as image reconstruction using the nuclear magnetic resonance signal (hereinafter, referred to as an MR signal) acquired by the measurement unit; and a control unit 30 that controls an operation of the units constituting the MRI device, such as the measurement unit 10 and the calculation unit 20. The control unit 30 may be a part of a function of the calculation unit 20. Furthermore, the MRI device can include a user interface device 40 provided with a device. The device allows a user to input commands for starting and ending imaging and setting imaging conditions and the like to the measurement unit 10 and the control unit 30, and presents a processing result of the calculation unit 20 to the user.

The measurement unit 10 has a configuration similar to that of a general MRI device, and includes: a static magnetic field generation unit 11 that generates a uniform magnetic field in a space in which a subject is placed; a gradient magnetic field generation unit 12 that gives a magnetic field gradient to a static magnetic field; a transmission unit 13 that performs irradiation with a high frequency magnetic field pulse (hereinafter, referred to as an RF pulse) exciting atomic nuclei, typically protons, of atoms constituting a tissue of the subject; and a receiving unit 14 that receives a nuclear magnetic resonance signal generated from the subject.

Figure 2:
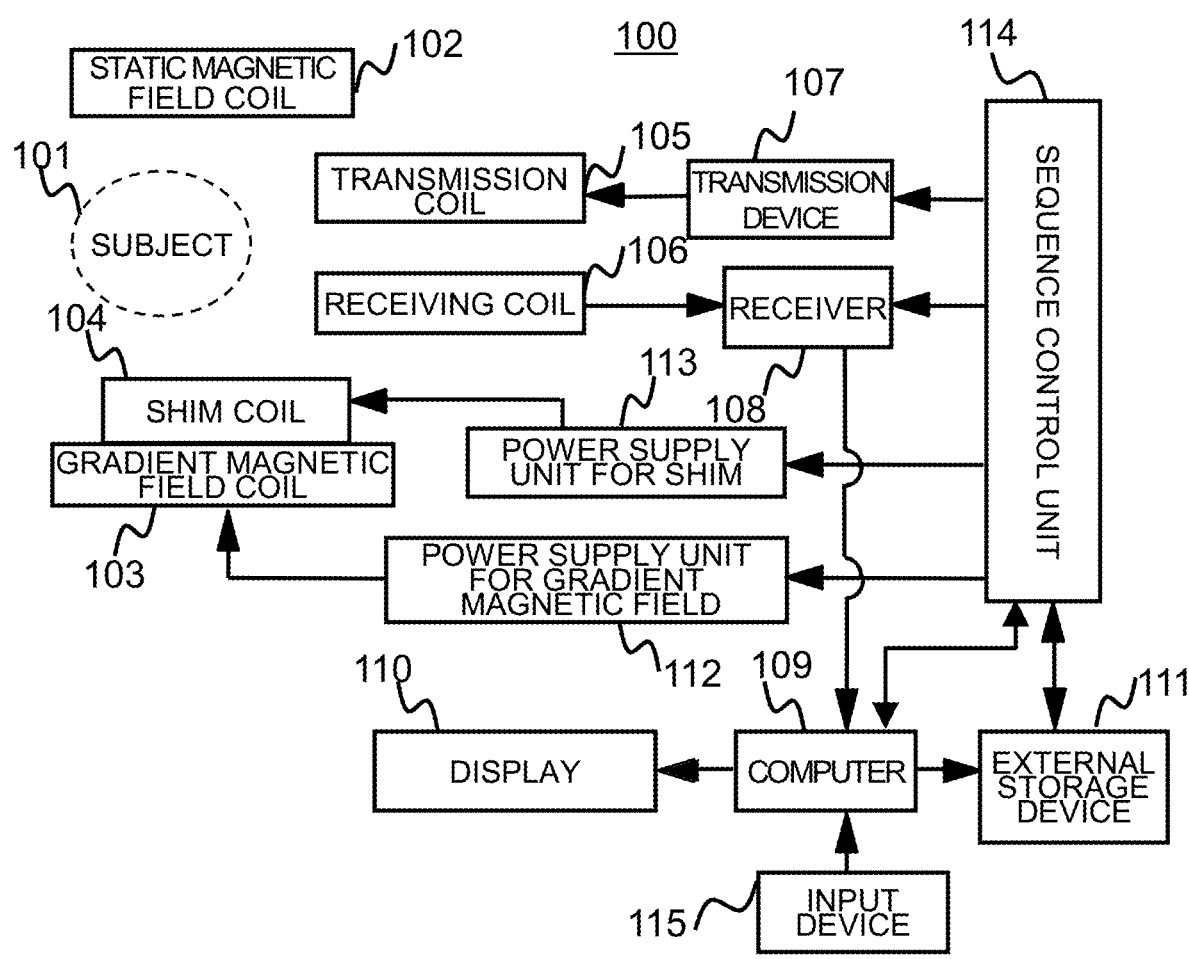
FIG. 2 is a diagram illustrating an overall configuration of the MRI device according to an embodiment.

Specifically, as illustrated in FIG. 2, the static magnetic field generation unit 11 includes a static magnetic field coil 102, a shim coil 104 that corrects magnetic field uniformity of the static magnetic field coil 102, and a power supply unit 113 thereof. The gradient magnetic field generation unit 12 includes a gradient magnetic field coil 103 and the power supply unit 113 thereof. The transmission unit 13 includes a transmission coil 105 and a transmission device 107 that transmits an RF signal to the transmission coil 105. The receiving unit includes a receiving coil 106 and a receiver 108 that detects an MR signal received by the receiving coil 106.

As the static magnetic field generation unit 11, a static magnetic field coil 102 of a normal conduction magnet type or a superconducting magnet type, or a permanent magnet can be used. Depending on a direction of a magnetic field, a vertical magnetic field type, a horizontal magnetic field type, or a type in which the direction of the magnetic field is inclined with respect to a horizontal direction are present, and any of these types may be adopted.

Although the gradient magnetic field coil 103 is illustrated as one block in FIG. 2, the gradient magnetic field coil 103 includes gradient magnetic field coils in three axial directions orthogonal to one another, and each of the gradient magnetic field coils is connected to a corresponding power supply unit 112. By applying a gradient magnetic field of each axis, it is possible to select an excitation region of the subject or add position information to the MR signal.

The transmission coil 105 is generally fixed in the static magnetic field space together with the shim coil 104 and the gradient magnetic field coil 103.

Although the receiving coil 106 is illustrated as one block in FIG. 2, the receiving coil 106 comprised a receiving coil having a plurality of channels, and has a function of executing reception for each channel. As the receiving coil having the plurality of channels, a plurality of known coils such a receiving coil in which sub-coils each corresponding to a respective one of the channels are combined, a receiving coil in which a plurality of loop coils are arranged in a predetermined arrangement, and the like can be used. Here, the sub-coils or the loop coils correspond to the individual receiving coils. As the receiving coil 106, a body coil also serving as a transmission coil may also be used, and reception may be executed by switching the body coil.

Under control of the control unit 30, the measurement unit 10 operates the transmission coil 105 and the gradient magnetic field coil 103 according to an imaging condition designated by the user and a predetermined pulse sequence to irradiate a subject 101 in the static magnetic field with the RF pulse, and thereby the receiving coil 106 receives an MR signal generated from the subject. In the control executed by the control unit 30, control on the measurement unit 10 using a pulse sequence is executed by a sequence control device 114. A known MRI technique can be adopted as an imaging method executed by the measurement unit 10 unless otherwise specified.

The calculation unit 20 includes a sensitivity distribution calculation unit 21 that calculates a sensitivity distribution of the receiving coil using the nuclear magnetic resonance signal measured by the measurement unit 10, and an image generation unit 23 that generates an image using the sensitivity distribution calculated by the sensitivity distribution calculation unit 21 and k-space data as measurement data. In the present embodiment, the sensitivity distribution calculation unit obtains a frequency component of the sensitivity distribution for each channel of the receiving coil by executing calculation in the k-space using sensitivity distribution calculation data, and calculates a coil sensitivity distribution as real space data or a weight (collectively referred to as a sensitivity distribution) in the k-space corresponding to the sensitivity distribution using the frequency component. At this time, the image used for the sensitivity distribution is subjected to an inversion process and an expanded image creation process, which will be described in detail later, and the sensitivity distribution is calculated using an expanded image. The image generation unit 23 executes image reconstruction based on a parallel imaging method using the calculated sensitivity distribution or the calculated weight in the k-space.

A function of the calculation unit 20 can be achieved by, for example, installing and executing a program defining procedures of sensitivity distribution calculation or image generation on a computer including a CPU or a GPU and a memory. However, a part or all of the calculation may be executed by hardware such as an application specific integrated circuit (ASIC) or a field programmable gate array (FPGA), or may be executed by a computer other than the MRI device or an operation unit on the cloud.

The control unit 30 includes the sequence control device 114 that controls the measurement unit 10 according to the predetermined pulse sequence, and controls operations of the measurement unit 10 and the calculation unit 20. When the calculation unit 20 is implemented by the CPU of the computer, a part or all of functions of the control unit 30 may be achieved by installing a control program on the same CPU, or may be achieved by another CPU or hardware.

In the configuration illustrated in FIG. 2, functions of the calculation unit 20 and the control unit 30 achieved by software are incorporated in a computer 109, and the computer 109 is connected to a display 110 and an input device 115 that serve as the user interface device 40, an external storage device 111, and the like.

Figure 3:
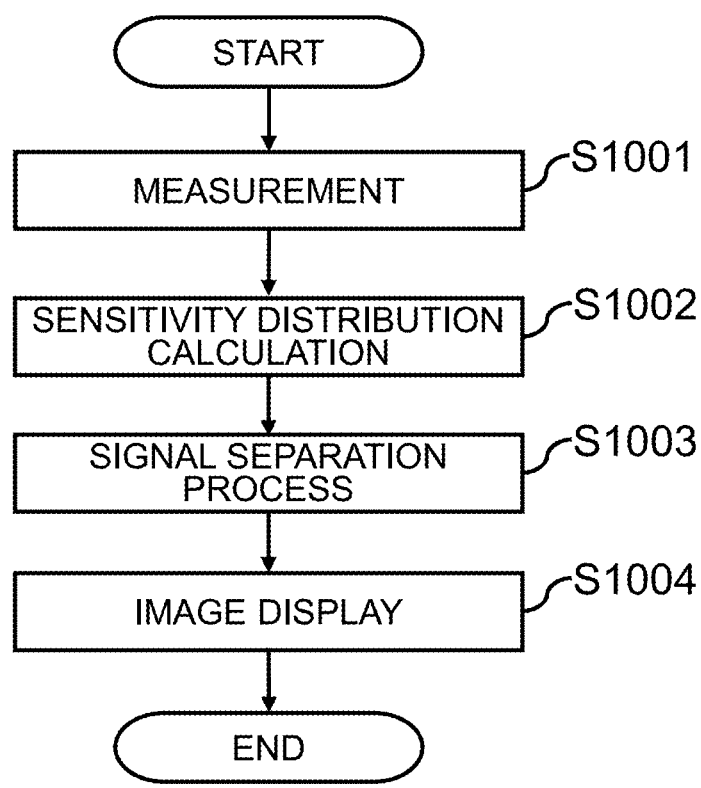
FIG. 3 is a diagram illustrating an imaging procedure according to a first embodiment.

An outline of an imaging procedure when parallel imaging is executed using the MRI device according to the present embodiment will be described. As illustrated in FIG. 3, imaging which is the parallel imaging includes steps of measurement (S1001), sensitivity distribution calculation (S1002), a signal separation process (S1003), and image display (S1004).

In the measurement step S1001, the receiving coils having the plurality of channels are used, and an NMR signal is measured by each receiving coil to acquire image data for each channel. The NMR signal is k-space data of a predetermined matrix size determined by phase encoding or the number of times of sampling, and in the parallel imaging, high-speed measurement is executed by executing thinning measurement (undersampling) on the signal.

In the sensitivity distribution calculation step S1002, sensitivity distribution of each channel is calculated. In the calculation of the sensitivity distribution, reference image data obtained by eliminating the influence of the sensitivity distribution and image data of each channel are used. These images for calculating sensitivity distribution may be acquired by executing measurement separately from the measurement (the main measurement) in step S1001, or sensitivity distribution data may be acquired in the main measurement. In the case in which a wide-region receiving coil such as a body coil is provided, a reference image may also be acquired using the wide-region receiving coil. In the MRI device according to the present embodiment, the sensitivity distribution of each channel or a weight coefficient in the k-space is calculated by executing calculation in the k-space using these images for obtaining sensitivity distribution. At this time, the inversion process is repeated on the image (an original image) generated based on the sensitivity distribution data to create an expanded image, and the expanded image is used as the sensitivity distribution data to execute the sensitivity distribution calculation in the frequency domain. Here, the expanded image is a combined image of the original image and the inverted image(s). Details of the inversion process and the sensitivity distribution calculation will be described later.

In the signal separation process step S1003, by executing undersampling, signals to be overlapped in the image space are separated (expanded) using the sensitivity distribution, and an image without aliasing is generated. The signal separation process can be executed using parallel imaging calculation such as a known SENSE method, a SMASH method, or a GRAPPA method.

In the image display step S1004, the image of the subject generated by executing the signal separation process is displayed on the display 110 or the like.

According to the MRI device in the present embodiment, the problem of spectrum leakage is not solved by enlarging the FOV of the image for obtaining sensitivity distribution by zero fill as in the related art, but is solved using the expanded image (the mirror image) of the sensitivity distribution data. Further, the problem that the sensitivity distribution oscillates in the no-signal region is solved, and a stable sensitivity distribution can be obtained. Furthermore, according to the present embodiment, the kernel size can be made relatively large in executing deconvolution calculation in the frequency domain, and the sensitivity distribution expressing a wide frequency domain can be obtained.

The reason for this will be briefly described below.

When an imaging region is imaged by a coil having a plurality of channels, the sensitivity is higher as the subject is closer to the coil. Therefore, usually, when the sensitivity distribution is higher at a certain end of the FOV, the sensitivity distribution becomes lower at an opposite end and becomes discontinuous at an end of the FOV. When Fourier transform (transform from image data to k-space data) is executed in this state, spectrum leakage occurs, and the sensitivity distribution has a wide frequency. In the related art, the problem is addressed by enlarging the FOV of the image for obtaining sensitivity distribution by twice or the like by zero fill, allowing any sensitivity distribution to a zero-filled region, and connecting the end of the FOV. In this case, any sensitivity distribution is present in the zero-filled region, a degree of freedom of a solution is increased, a large value is obtained over the entire region in the kernel, and the sensitivity distribution in the zero-filled region or a background region greatly oscillates.

In the present embodiment, instead of enlarging the image for obtaining sensitivity distribution by zero fill, by creating and using a mirror image as an expanded image, discontinuity at the end of the FOV can be eliminated while reducing the degree of freedom of the solution, and oscillation of the sensitivity distribution in the background region can be prevented.

The oscillation of the sensitivity distribution in the background region can be prevented by reducing the kernel size even in the related art, but reduction of the kernel size cannot correspond to a high frequency, which causes an error. In the present embodiment, since the oscillation can be prevented, the kernel size can be relatively large, and the sensitivity distribution expressed also for the high frequency can be obtained.

Next, embodiments will be described in which functions of the sensitivity distribution calculation unit are further embodied. In the following embodiments, an embodiment of a sensitivity distribution calculation method will be described focusing on a function of the sensitivity distribution calculation unit 21, and functions of the measurement unit 10 and the image generation unit 23 will also be referred to as necessary. Among configurations illustrated in FIGS. 1 and 3, for configurations common to the embodiments, the drawings will be appropriately referred to.

First Embodiment

In the present embodiment, a case will be described in which a two-dimensional (2D) sensitivity distribution is calculated. In order to calculate the 2D sensitivity distribution, a process of inverting the sensitivity distribution data (an original image for obtaining sensitivity distribution) obtained in a sensitivity distribution sequence is repeated, and a 2D expanded image is generated and used in the calculation of the sensitivity distribution.

Processes of the MRI device according to the present embodiment will be described again with reference to FIG. 3. Here, as an example, a case will be described in which a two-dimensional (2D) sensitivity distribution is calculated using data (sensitivity distribution data) obtained by a three-dimensional (3D) sensitivity distribution sequence.

First, in the measurement step (S1001 in FIG. 3), the measurement unit 10 executes measurement for obtaining the sensitivity distribution data. In the present embodiment, the sensitivity distribution data is acquired by executing a sensitivity distribution pulse sequence separately from the main imaging pulse sequence (the main imaging sequence) for obtaining the image of the subject. The sensitivity distribution data is acquired by both the receiving coil (hereinafter, referred to as an array coil) having the plurality of channels and the body coil.

Figure 4:
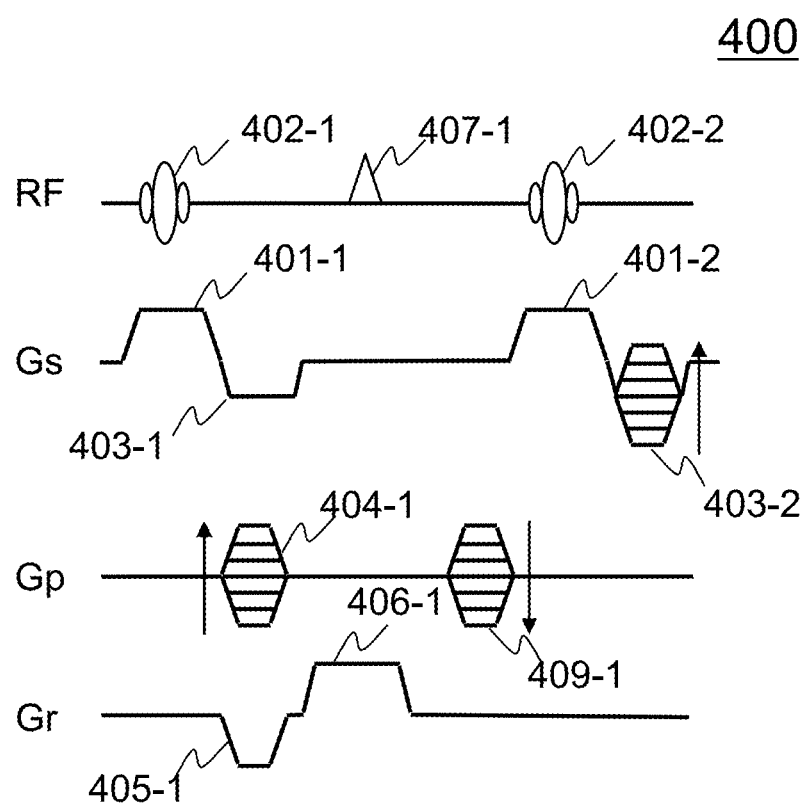
FIG. 4 is a diagram illustrating an example of a sensitivity distribution calculation pulse sequence according to the first embodiment.

A type of the pulse sequence is not particularly limited, and FIG. 4 illustrates a pulse sequence 400 of a typical 3D-GrE (gradient echo) method as an example of the sensitivity distribution sequence. In the drawing, in order from the top, RF represents irradiation timings of a high frequency magnetic field pulse 402 and a reception timing of a nuclear magnetic resonance signal 407, and Gs, Gp, and Gr respectively represent a polarity/intensity and application timings of gradient magnetic field pulses in the three axial directions orthogonal to one another. Regarding three-digit numbers, the same number indicates a pulse of the same type, and regarding numbers following the three-digit numbers with hyphen, the same number indicates a pulse applied within the same repetition time. Gs represents a slice selection gradient magnetic field, Gp represents a phase encoding gradient magnetic field, and Gr represents a readout gradient magnetic field. Vertical arrows illustrated next to the pulse indicate that a gradient magnetic field intensity changes each time the pulse sequence is repeated.

In the imaging sequence in FIG. 4, first, an RF pulse 402 and a slice selection gradient magnetic field 401 are applied to excite a predetermined region, and then a rephasing pulse 403 and a phase encoding pulse 404 of the slice gradient magnetic field Gs are applied. At this time, a dephasing pulse 405 of the readout gradient magnetic field Gr is applied, and a nuclear magnetic resonance signal 407 is sampled while applying the rephasing pulse whose polarity is inverted. Finally, a rephasing pulse 409 is applied in a phase encoding direction. Application of the RF pulse 402 to application of the rephasing pulse 409 are repeated during a predetermined repetition time TR, and a nuclear magnetic resonance signal necessary for the image reconstruction is collected. Digital data of the sampled nuclear magnetic resonance signal becomes the k-space data. In this sequence, 3D-data is obtained. The 3D-data is obtained for each channel of the array coil and for the body coil.

The main imaging sequence and the sensitivity distribution sequence may be the same or different in sequence type. In a case of the sensitivity distribution sequence, the number of encoding steps is small for both slice encoding and phase encoding, and a low-resolution image for obtaining sensitivity distribution is acquired. Accordingly, when the sensitivity distribution sequence is executed as pre-scanning other than the main imaging sequence, a measurement time required for the pre-scanning can be limited to a short time.

However, since low-resolution sensitivity distribution does not match a high-resolution image obtained by executing the main imaging in resolution or field of view (FOV), in order to apply the coil sensitivity distribution to the image reconstruction, a process for matching the low-resolution sensitivity distribution with the image obtained by executing the main imaging is executed in a sensitivity distribution calculation process to be described later.

Next, in the sensitivity distribution calculation step (S1002 in FIG. 3), the sensitivity distribution calculation unit 21 calculates, using the sensitivity distribution data (hereinafter, referred to as Smap data) collected by the measurement unit 10, a coil sensitivity distribution to be applied to the image (a target image) obtained by executing the main imaging. In the present embodiment, since parallel imaging is executed, a coil sensitivity distribution is calculated for each of the plurality of receiving coils (the channels).

Figure 5:
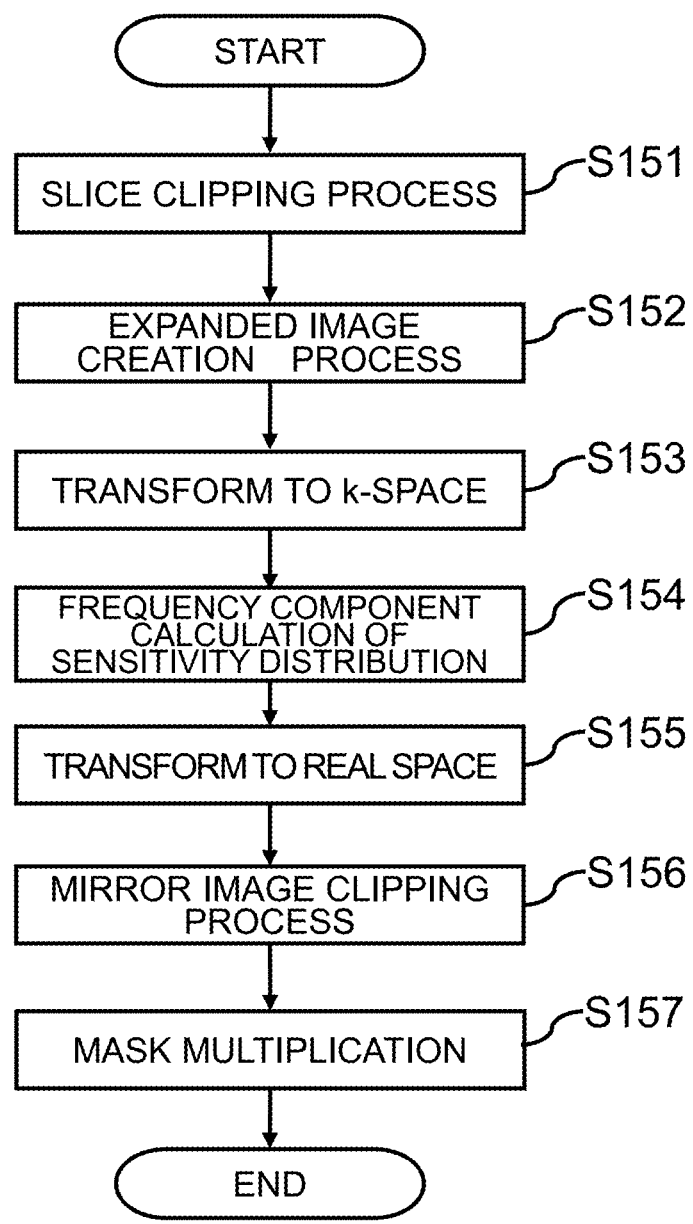
FIG. 5 is a diagram illustrating a procedure of sensitivity distribution calculation.

Details of the sensitivity distribution calculation step S1002 are illustrated in FIG. 5. The sensitivity distribution calculation roughly includes: a slice clipping process S151; an expanded image creation process S152; transform S153 of Smap data serving as an expanded image into k-space data; frequency component calculation S154 of each receiving coil using the k-space data; transform S155 of the frequency component (the k-space) of the sensitivity distribution into real space data; and a process S156 of clipping an original region from the sensitivity distribution serving as the expanded image. The sensitivity distribution calculation further includes a process S157 of multiplying the original region by a mask image as necessary.

Figure 6:
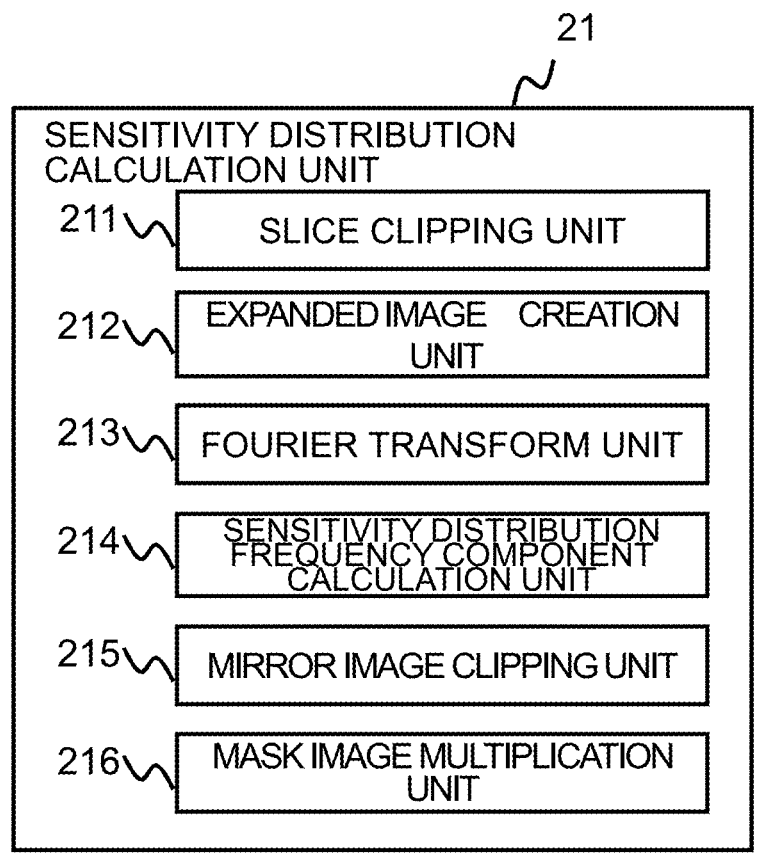
FIG. 6 is a functional block diagram of a sensitivity distribution calculation unit.

In order to execute these processes, for example, as illustrated in the functional block diagram of FIG. 6, the sensitivity distribution calculation unit 21 includes a slice clipping unit 211, an expanded image creation unit 212, a Fourier transform unit 213, a sensitivity distribution frequency component calculation unit 214, a mirror image clipping unit 215, and a mask image multiplication unit 216. FIG. 6 is merely an example of the sensitivity distribution calculation unit 21, and a part of functional units may be omitted as appropriate, or other functional units may be added. Hereinafter, as operations of the units, details of the processes executed by the sensitivity distribution calculation unit 21 will be described.

Slice Clipping Process S151

The slice clipping process is executed on each of the Smap data (the number of pieces of Smap data is the same as the number of channels) received by the array coil and the Smap data received by the body coil. Since the Smap data obtained by the body coil is used as a reference in the subsequent sensitivity distribution calculation, the Smap data is referred to as Ref data (Ref image data for the image space) in the following description.

Figure 7:
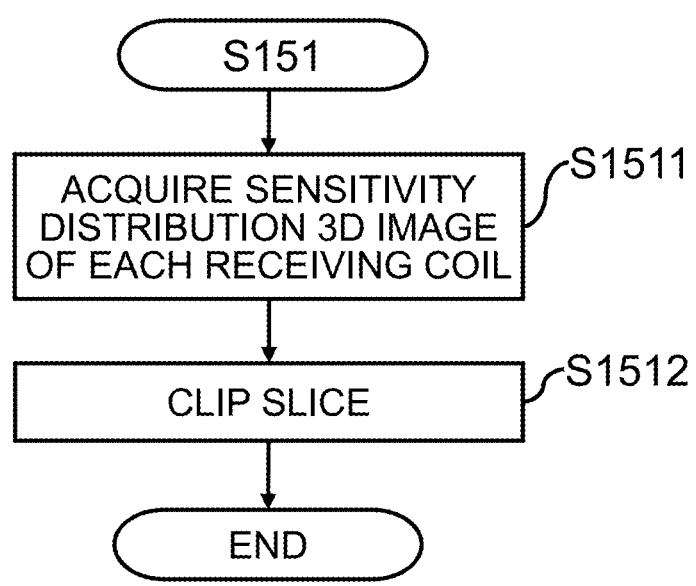
FIG. 7 is a diagram illustrating details of a slice clipping process in a flow in FIG. 5.

Details of the slice clipping process S151 are illustrated in FIG. 7.

In the slice clipping process S151, first, the Fourier transform unit 213 executes Fourier transform on each of the 3D-Smap data and the 3D-Ref data to transform the k-space data to image data (real space data) (S1511), and then the slice clipping unit 211 clips the 2D image data (slice) from the 3D image data which is the real space data (S1512). At this time, the 2D image data of the slice to be clipped is clipped such that the FOV thereof is the same as the FOV of the target image (an image obtained in the main imaging sequence). In general, in sensitivity distribution measurement, since the image for obtaining sensitivity distribution is acquired in an FOV larger than the FOV of the target image, the FOV of the image for obtaining sensitivity distribution is caused to coincide with the FOV of the target image. However, the image is a low-resolution image in which a matrix size of the image for obtaining sensitivity distribution is smaller than that of the target image.

Expanded Image Creation Process S152

Figure 8A:
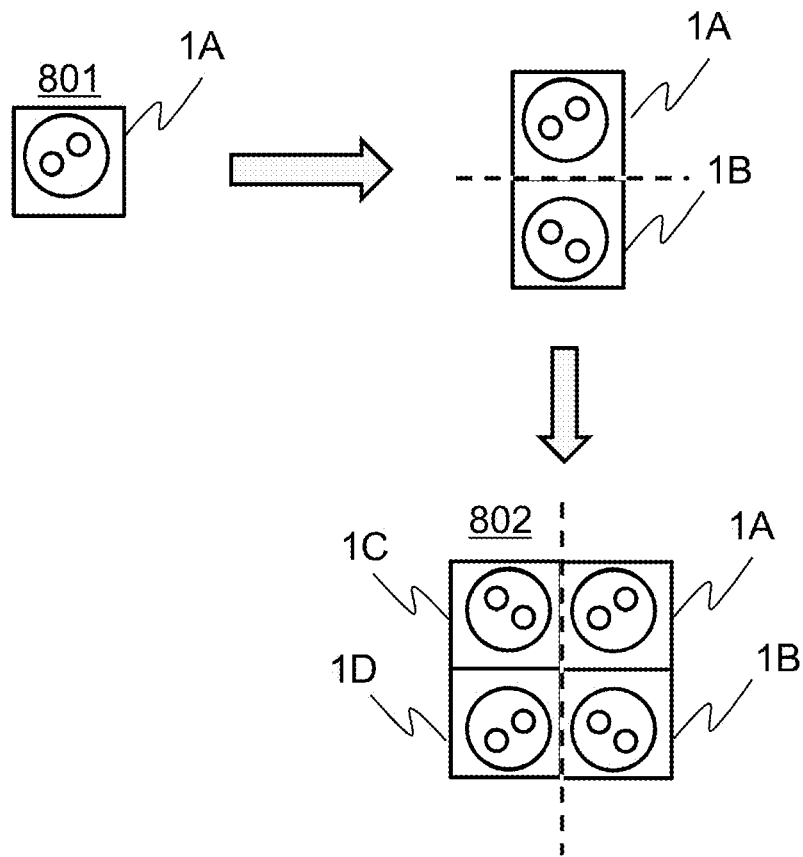
FIG. 8A is a diagram illustrating details of a process of loading an image into a mirror image.

The expanded image creation unit 212 repeats the inversion process on the 2D-Smap image data and the 2D-Ref image data that are obtained by the slice clipping unit 211 in the slice clipping process S151 to create an expanded image. Details of the inversion process are illustrated in FIG. 8A. In FIG. 8A, an image 1A illustrated at the upper left is 2D-Smap image data 801 obtained in the slice clipping process S151, and is considered as the original image. First, the original image 1A is copied downward in a manner of being line-symmetric to create a first mirror image 1B. Next, an image (1A+1B) obtained by combining the original image 1A and the mirror image 1B is copied leftward in a manner of being line-symmetric to create a second mirror image (1C+1D), and the image (1A+1B) and the second mirror image (1C+1D) are combined to obtain a loaded image 802. The same process is executed also on the 2D-Ref image data.

Fourier Transform S153

The Fourier transform unit 213 executes Fourier transform on the expanded image obtained by the expanded image creation unit 212 executing mirror image expanding in the expanded image creation process S152 to obtain frequency space data, that is, k-space data.

Frequency Component Calculation S154

The sensitivity distribution frequency component calculation unit 214 calculates a frequency component of the sensitivity distribution based on the k-space data of the Smap image. For calculation of the frequency component of the sensitivity distribution, a method described in Patent Literature 1 can be applied. Hereinafter, a method for calculating the frequency component of the sensitivity distribution will be described with reference to FIG. 9.

In the expanded image creation process S152, Smap image data created by executing mirror image expanding based on data received in an i-th channel of the array coil is referred to as Si, and Ref image data created by executing the mirror image expanding based on data received in the body coil is referred to as Sb.

Figure 9:
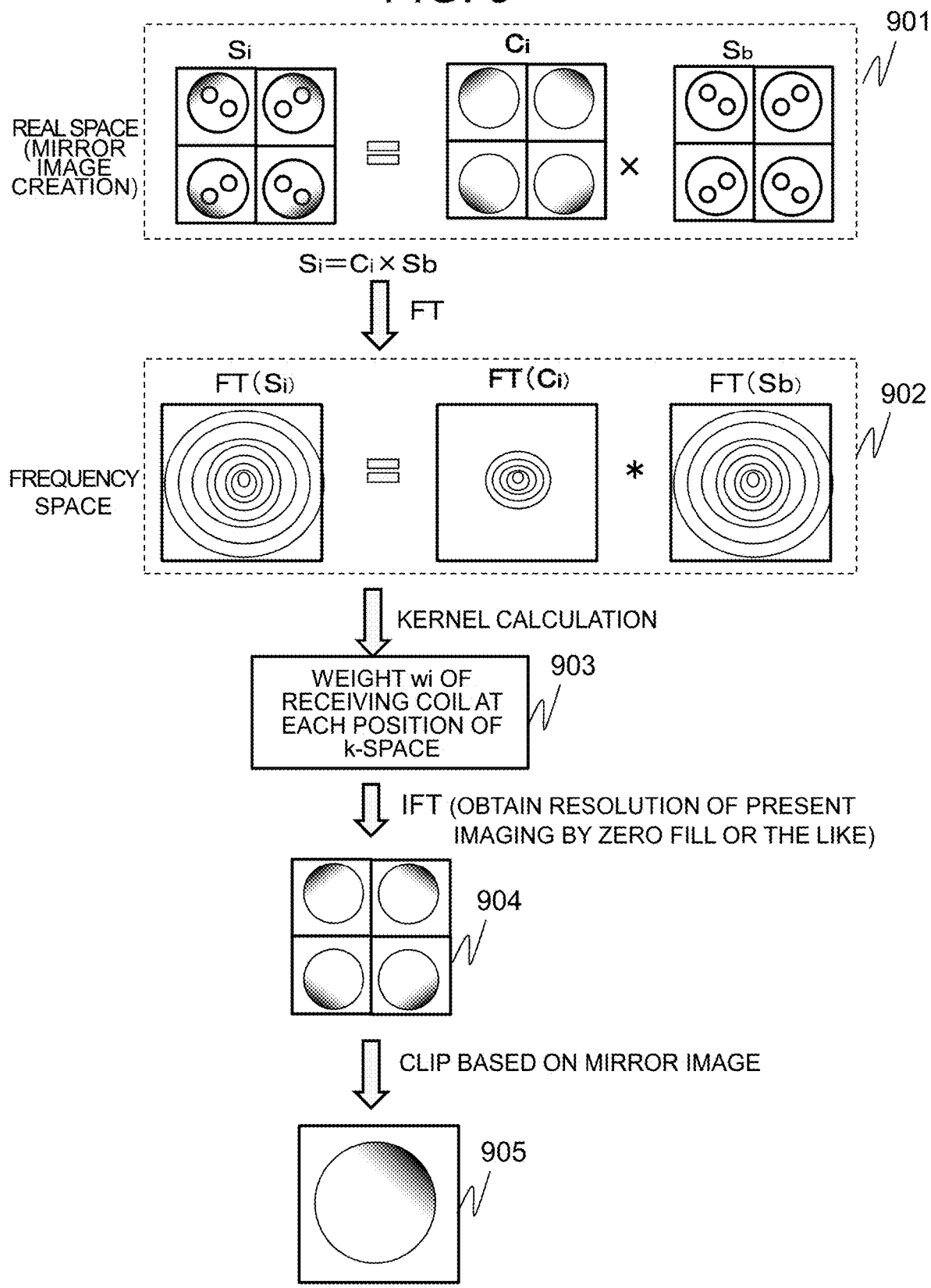
FIG. 9 is a diagram illustrating a process according to the first embodiment.

In a real space, when a vector at each position in the real space is referred to as r, an Smap image Si(r) in the i-th channel of the array coil is represented by a product of a sensitivity distribution Ci(r) of each coil and a Ref image Sb(r) as indicated in an equation (1) (901 in FIG. 9).

$$Si(r)=Ci(r)\times Sb(r) \quad (1)$$

When both sides of the equation (1) are transformed into the k-space data, a relationship of Equation (1) is represented by a convolution in an equation (2) (902 in FIG. 9).

$$Si'(k)=Ci'(k)*Sb'(k) \quad (2)$$

In the equation, k represents a k-space position vector, and Si' (k), Ci' (k), and Sb' (k) respectively represents those obtained by transforming real space images of Si(r), Ci(r), and Sb(r) into k-space data (the same applies hereinafter).

As shown in the equation (2), Si' (k) is obtained by convolving Sb' (k) and the sensitivity distribution frequency component Ci'(k).

The above-mentioned equation (2) can be represented as an equation (3) by ignoring high frequency regions of Si' (k) and Ci' (k) and using a weight coefficient wi of a predetermined kernel size.

$$S_i'(k_x,k_y)=\Sigma_{b_x=-(B_x-1)/2}^{(B_x-1)/2}\Sigma_{b_y=-(B_y-1)/2}^{(B_y-1)/2}w_i(b_x,b_y)S_b'(k_x+b_x,k_y+b_y) \quad (3)$$

In the Equation (3), kx and ky represent positions in the k-space, bx and by represent positions in the k-space in a kernel, and Bx and By represent kernel sizes. Although the kernel size is not particularly limited, the smaller the kernel size is, the larger the high frequency component to be ignored is. From assumption that the sensitivity distribution generally changes gently, even in a boundary region of the subject, the sensitivity distribution can be stably obtained using data of a region around the boundary region by setting the kernel size to a small size such as 11×11 or 19×19.

When elements of Si' and elements of wi in the equation (3) are re-expressed as a vector in which the elements are vertically arranged and when Sb' is re-expressed as a matrix in which the elements are rearranged correspondingly, the equation (3) can be rewritten to an equation (4), and the weight vector wi (that is, the weight coefficient) can be calculated based on a pseudo inverse matrix indicated in an equation (5).

$$S'_i=S'_b w_i \quad (4)$$

$$w_i=(S'_b{}^H S'_b)^{-1} S'_b{}^H S'_i \quad (5)$$

where H represents an adjoint matrix. If sizes of the Smap image are Nx and Ny (Nx and Ny are even numbers), a size of the matrix Sb' is (vertical, horizontal)={(Nx−Bx+1)× (Ny−By+1), Bx×By} when the kernel size is an odd number.

The weight coefficient wi corresponds to the sensitivity distribution frequency component of the receiving coil (the channel), but is not the sensitivity distribution frequency component itself (903 in FIG. 9) because the image which is the premise of the calculation is the expanded image.

Transform S155 to Real Space

The Fourier transform unit 213 matches the weight coefficient wi obtained in this way with the resolution of the main imaging by zero fill (zero fill in the k-space) or the like, and then transforms the weight coefficient wi into image data by executing inverse Fourier transform. As illustrated in FIG. 9, the obtained image is an image 904 obtained by expanding the sensitivity distribution image by reflecting S1 and Sb used for calculating the sensitivity distribution frequency component.

Mirror Image Clipping Process S156

Figure 8B:
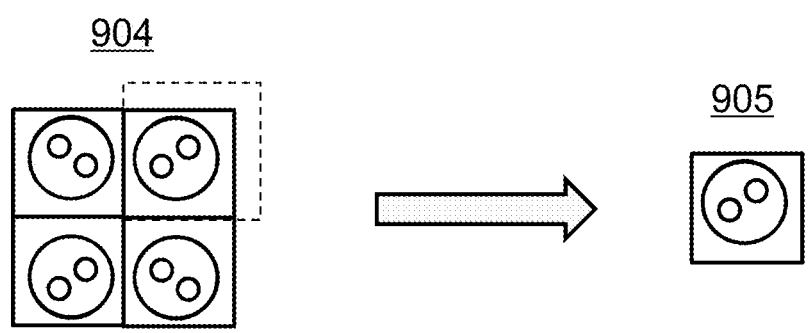
FIG. 8B is a diagram illustrating details of a process of clipping the image based on the mirror image.

As illustrated in FIG. 8B, the mirror image clipping unit 215 clips an original region (a region corresponding to the Smap image 801 in FIG. 8) before the original Smap image is expanded to a mirror image based on the image 904 after the inverse Fourier transform, and obtains a sensitivity distribution (a sensitivity map) 905 which is real space data.

Mask Multiplication S157

Thereafter, the mask image multiplication unit 216 multiplies the sensitivity distribution image 905 after the Fourier transform by a predetermined mask image (not illustrated) in order to eliminate noise around the sensitivity distribution. Therefore, the mask image multiplication unit 216 creates a mask image based on the low-resolution image acquired as the sensitivity distribution image. The mask image can be created at any time after the slice is clipped from a 3D sensitive image (1512 in FIG. 7).

By executing S151 to S157 described above, the sensitivity distribution calculation process S1002 in FIG. 3 ends. These processes are executed for each channel of the receiving coil and for each slice position clipped in S151, and a sensitivity distribution for each slice is obtained for each channel.

Thereafter, processes (the signal separation step S1003 and the image display step S1004 in FIG. 3) of generating an image by executing parallel imaging calculation using the sensitivity distribution calculated by the above-mentioned processes are as described above. In the present embodiment, the sensitivity distribution is obtained for each slice. Therefore, if the image obtained by the main imaging sequence is a 3D image, the signal separation process is executed for each slice for the image at a corresponding slice position.

If the image obtained by the main imaging is a multi-slice image, in the slice clipping (S1512), the same slice position as that of the slice of the main imaging is clipped to execute the sensitivity distribution calculation, and the signal separation process is executed for each slice of a corresponding multi-slice image using the sensitivity distribution at the corresponding slice position.

According to the present embodiment, when the sensitivity distribution is calculated in the frequency domain, an image obtained by expanding (iterative inversion) the original image is used as the sensitivity distribution data, thereby preventing oscillation in the no-signal region that is generated in the sensitivity distribution obtained when the original image is used as it is, and stably attaining the sensitivity distribution. Since the oscillation can be effectively prevented, the kernel size can be relatively large. Accordingly, the high frequency component of the sensitivity distribution can be expressed, and the accuracy of the signal separation process in the parallel imaging can be improved.

Figure 10:
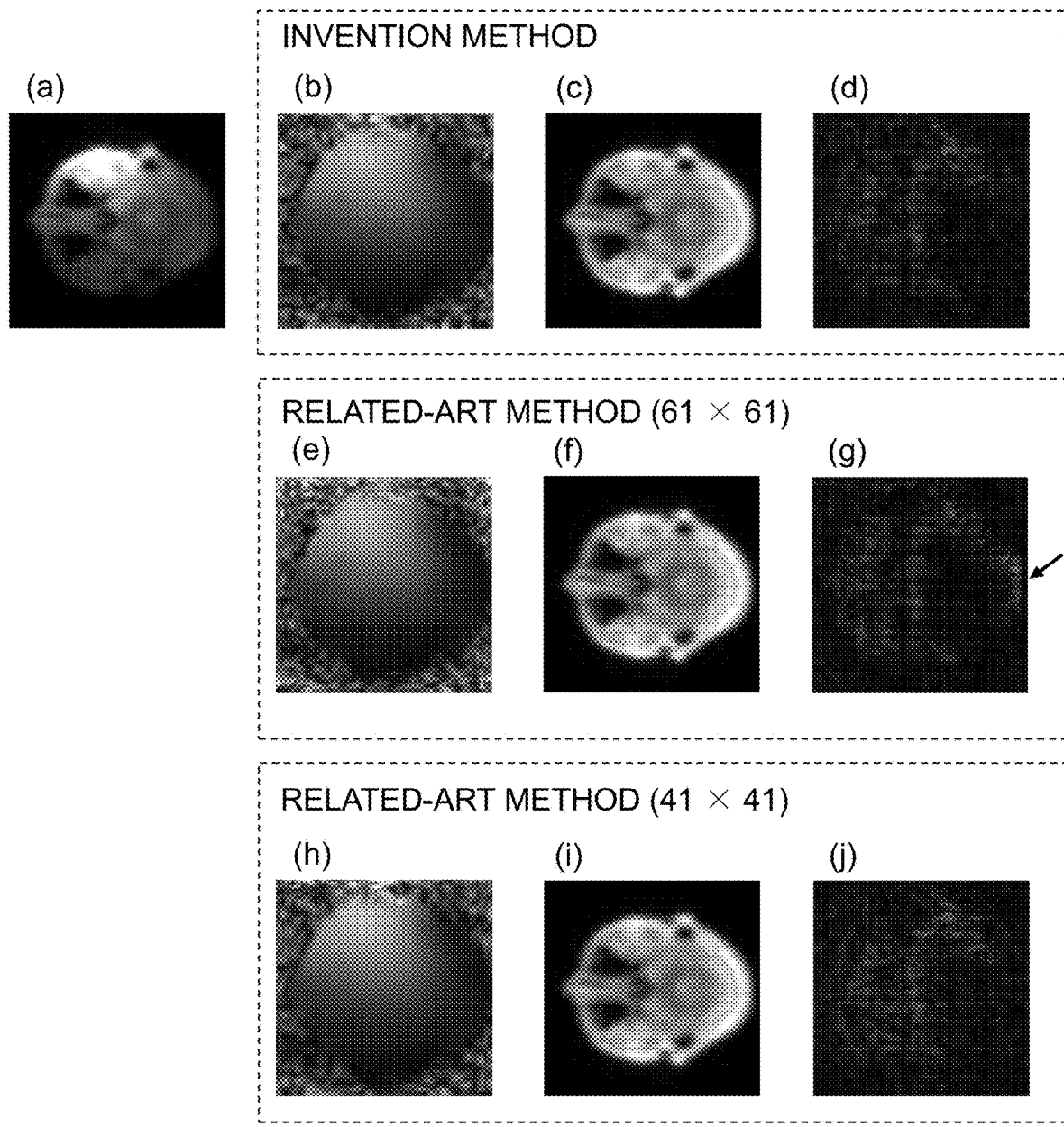
FIG. 10 is a diagram illustrating an effect according to the first embodiment.

In order to check an effect according to the present embodiment, FIG. 10 illustrates a result of calculating the sensitivity distribution image by actually using an image of a human head. In FIG. 10, (a) is an Smap image received on a certain channel, (b) is a sensitivity distribution image calculated with a kernel size of 61×61 using the sensitivity distribution calculation method according to the present embodiment, (c) is an image Smac(r) obtained by synthesizing channel images of the Smap image using the sensitivity distribution according to the following equation (6), and (d) is an absolute value of a difference between an image obtained by multiplying the combined image in (c) by the sensitivity distribution in (b) and an image of each channel in (a), is obtained by weighting a sensitivity distribution error of each channel by the magnitude of a pixel value, and is an indication of the magnitude of an error occurring in the image reconstruction.

$$S_{mac}(r) = (\Sigma_i \overline{C_i(r)} \times S_i(r))/(\Sigma_i \overline{C_i(r)} \times C_i(r)) \qquad (6)$$

where an overbar represents a complex conjugate.

On the other hand, (e), (f), and (g) are results calculated by executing zero fill on the FOV of the original image approximately twice according to the related-art method, not according to the method of expanding the original image into a mirror image according to the present embodiment, and (e), (f), and (g) correspond to (b), (c), and (d), respectively. The kernel size is also 61×61. Furthermore, results of reducing the kernel size to 41×41 according to the related-art method are shown as (h), (i), and (j).

It can be seen that the oscillation in the background region is smaller in the sensitivity distribution according to the present embodiment in (b) than in the sensitivity distribution (e) according to the related art. Since the error occurring in a region indicated by an arrow in (g) in the boundary region of the subject does not occur in (d), it can be seen that the oscillation in the boundary region of the subject is also prevented. It can be seen that the errors in a region inside the subject are equivalent to each other by comparing (d) and (g).

Even in the related art, if the kernel size is reduced from 61×61 to 41×41, as shown in (h), the oscillation of the sensitivity distribution is prevented to the same extent as in (b), but the error in (j) is generally larger than that in (d).

The first embodiment of the MRI device according to the invention is described above. However, the method for acquiring image data for sensitivity distribution and the like are not limited to the method according to the first embodiment, and various modifications are possible.

First Modification and Second Modification

Figure 11:
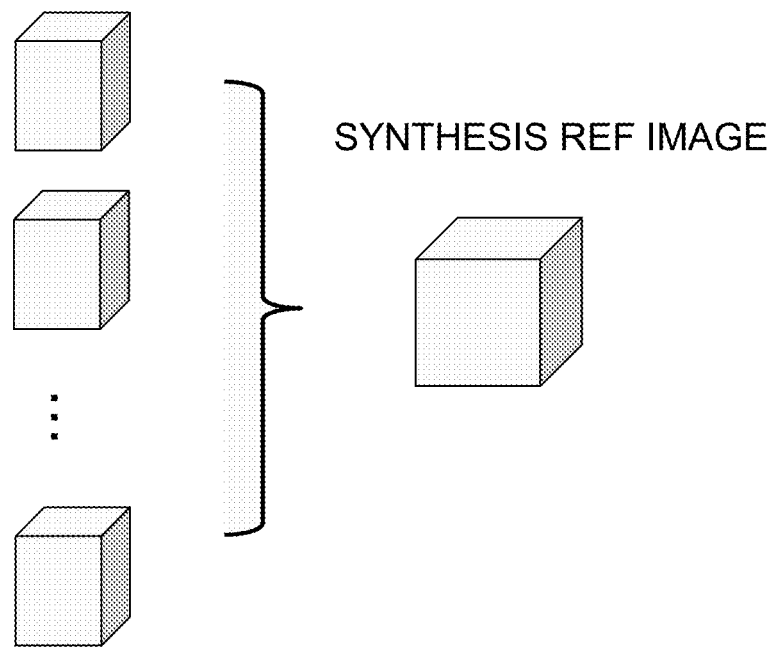
FIG. 11 is a diagram illustrating a process according to a first modification of the first embodiment.

For example, the data received by the body coil is used as the Ref image data in the first embodiment. Alternatively, as illustrated in FIG. 11, data obtained by synthesizing the Smap data of the array coil according to a method (a synthesis method using a temporary coil sensitivity map) as in Patent Literature 1 may be used instead of the data received by the body coil (a first modification).

In the first embodiment, the sensitivity distribution sequence is executed separately from the main imaging sequence. Alternatively, the sensitivity distribution calculation may be executed using a part of the measurement data obtained in the main imaging sequence (self-calibration) (a second modification).

Furthermore, the expanded image creation process S152 may be modified as follows.

Third Modification

In the first embodiment, in the expanded image creation process S152, the expanded image is obtained by directly using the image after the slice is clipped from the 3D-Smap image data as the mirror image. In the present modification, after the periphery of the original image is subjected to zero fill for each of the Smap image and the Ref image, the inversion process similar to the process according to the first embodiment is repeated, and the expanded image obtained by expanding the original image after the zero fill is generated. An outline of the process according to the present modification is illustrated in FIG. 12.

Figure 12:
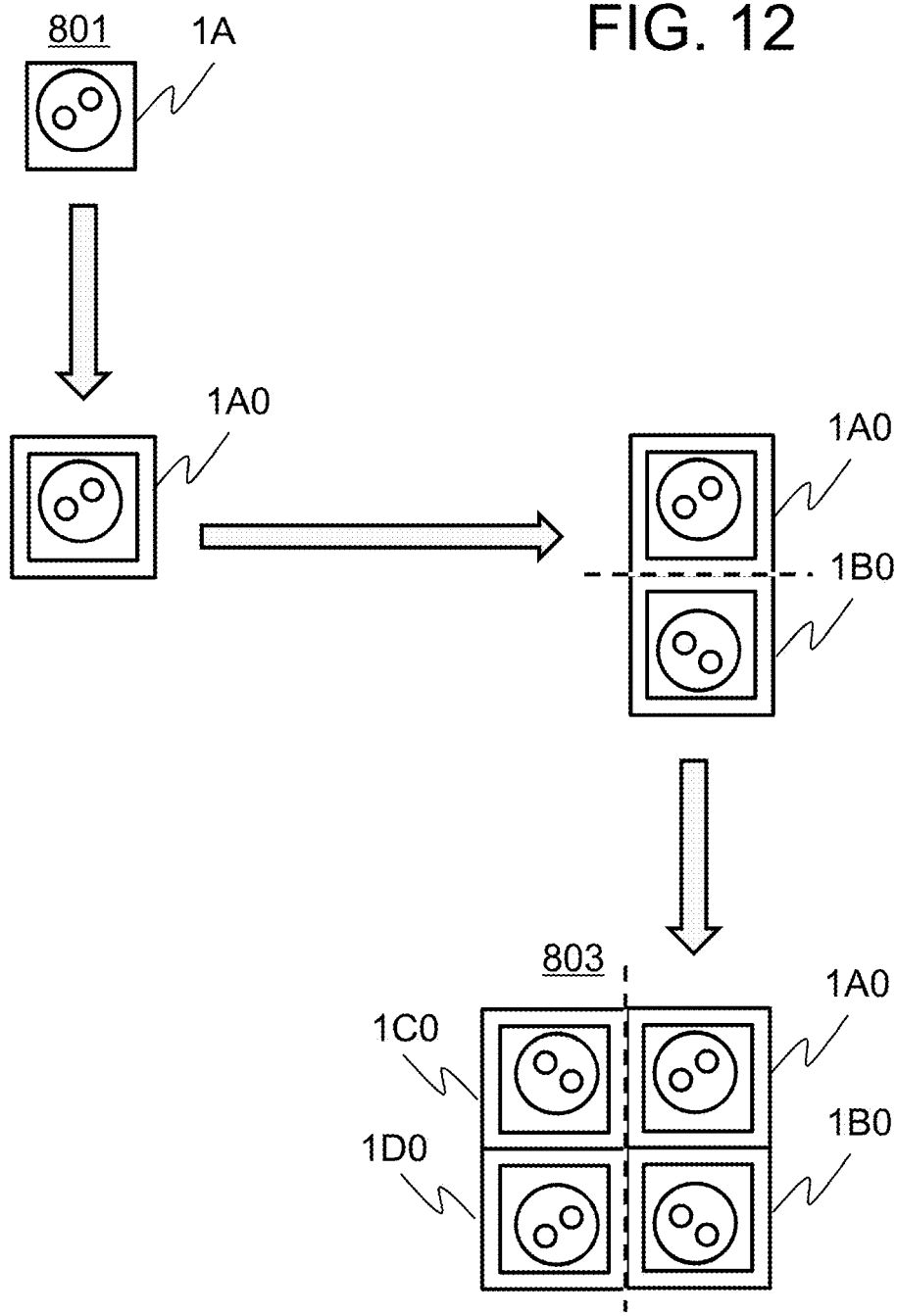
FIG. 12 is a diagram illustrating generation of an expanded image according to a third modification of the first embodiment.

In the present modification, as illustrated in FIG. 12, an image 1A0 is obtained by executing zero fill on the periphery of an original image 801 (1A) and enlarging the FOV. In zero fill in the related-art method, the image subjected to zero fill in this way is used as it is for the sensitivity distribution calculation in the frequency domain. In the present modification, similarly to the process (S152) according to the first embodiment, the process of copying the image 1A0 in a manner of being line-symmetric is executed twice, and an expanded image (1A0+1B0+1C0+1D0) 803 is generated. Calculation of the sensitivity distribution frequency component using the expanded image can be executed in the same manner as in the first embodiment.

According to the present modification, mirror images can be smoothly combined by combining images in which the periphery is slightly subjected to zero fill, and occurrence of oscillation in a no-signal region caused by an increase in the degree of freedom in the sensitivity distribution calculation can be prevented while maintaining the effect (prevention of spectrum leakage) of zero fill in the related-art method.

Fourth Modification

Figure 13:
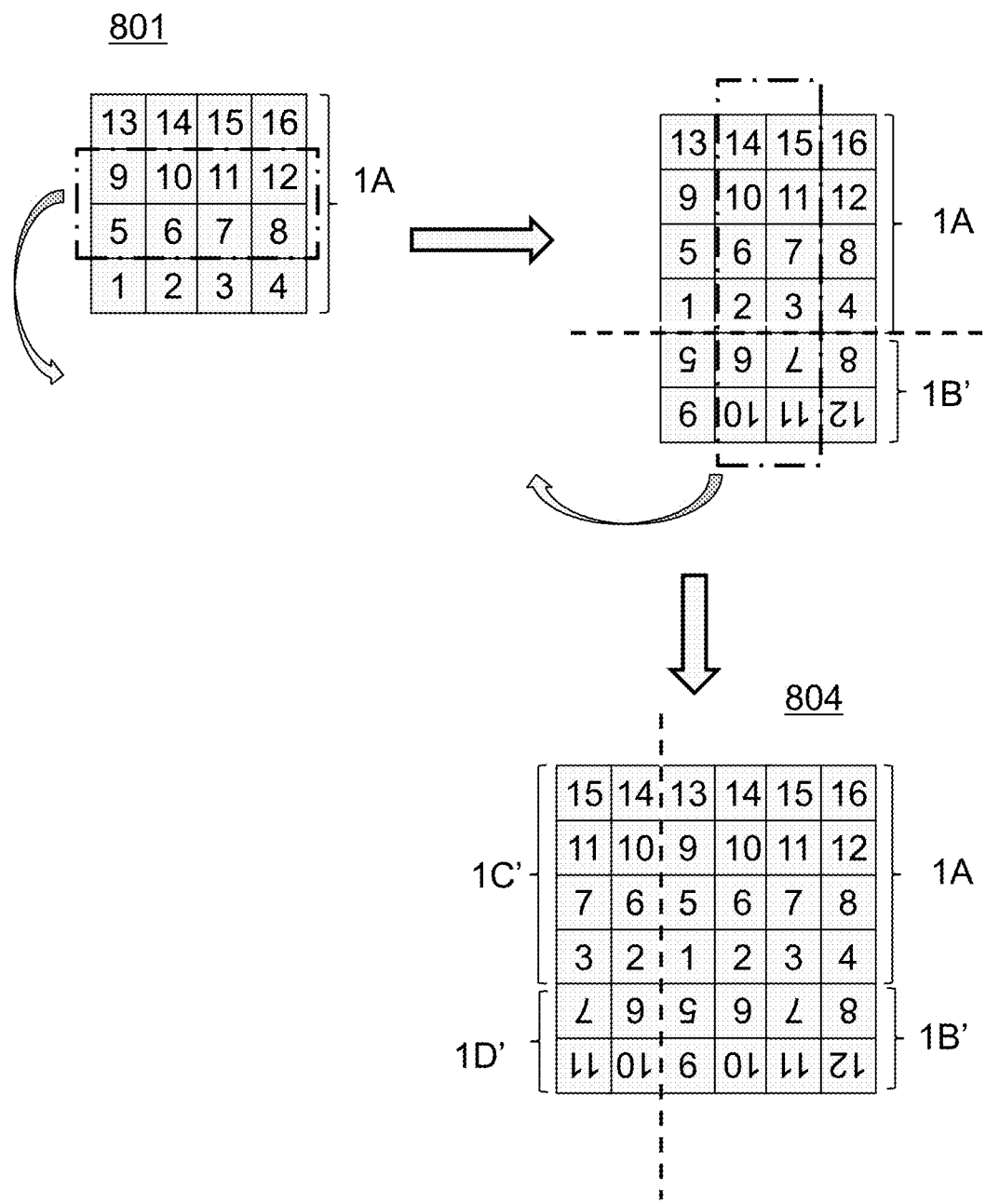
FIG. 13 is a diagram illustrating generation of an expanded image according to a fourth modification of the first embodiment.

In the first embodiment, the entire original image 1A is inverted to form the mirror image 1B. Alternatively, it is also possible to invert and combine only a part of the image. A process according to the present modification will be described with reference to FIG. 13. In FIG. 13, for easy understanding, an image of 4×4 is illustrated as an example. Numbers 1 to 16 are numbers for distinguishing pixels.

In a first inversion process, only pixels 5 to 12 in a central region in the original image 1A including 16 pixels are copied (1B'), and are combined in a manner of being line-symmetric with respect to pixels 1 to 4 of the original image 1A. Next, only pixels in the central two columns of the combined image (1A+1B') are copied, and are combined in a manner of being line-symmetric with respect to pixels in a leftmost column of the image (1A+1B'), thereby generating an expanded image 804. As described above, the expanded image 804 formed in the present modification is an image in which an upper left region (1A) of the expanded image 804 corresponds to the original image 801 and a matrix size thereof is smaller than that of the expanded image according to the first embodiment.

By using the expanded image 804 (the Smap image and the Ref image), the frequency component of the sensitivity distribution is calculated as the coefficient w1 in the k-space. Although the calculation method is the same as that according to the first embodiment, in the present modification, since the coefficients in the k-space to be calculated are mirror images in which end regions thereof do not overlap as in the image 804 in FIG. 13, it is sufficient to obtain only a range corresponding to the region 1A of the image 804. That is, a range of bx and by of the variable wi (bx, by) obtained according to the equation (3) is merely a range of 0 or more as in an equation (7), and the scale of calculation can be reduced.

$$S'_i(k_x, k_y) = \sum_{b_x=0}^{\frac{B_x-1}{2}} \left\{ w_i(b_x, 0) S'_b(k_x, k_y) + \sum_{b_y=1}^{\frac{B_y-1}{2}} w_i(b_x, b_y)(S'_b(k_x + b_x, k_y + b_y) + S'_b(k_x + b_x, k_y - b_y)) \right\} + \sum_{b_x=1}^{\frac{B_x-1}{2}} \left\{ w_i(b_x, 0) S'_b(k_x, k_y) + \sum_{b_y=1}^{\frac{B_y-1}{2}} w_i(b_x, b_y)(S'_b(k_x - b_x, k_y + b_y) + S'_b(k_x - b_x, k_y - b_y)) \right\} \quad (7)$$

As described above, according to the present modification, by combining images obtained by inverting only a part of the sensitivity distribution data, generating an expanded image, and using the expanded image for the sensitivity distribution calculation in the frequency domain, it is possible to achieve an effect of reducing an amount of calculation in addition to the same effect as that according to the first embodiment.

Second Embodiment

In the first embodiment, a case is described in which the main imaging is multi-slice imaging and the 2D sensitivity distribution for each slice is obtained. In the present embodiment, 3D data is acquired as the sensitivity distribution data and a 3D sensitivity distribution is calculated in 3D imaging.

In the present embodiment, in the measurement step (S1001 in FIG. 3), the 3D imaging is executed in both the main imaging sequence and the sensitivity distribution sequence, and the 3D data is obtained as the sensitivity distribution data.

Figure 14:
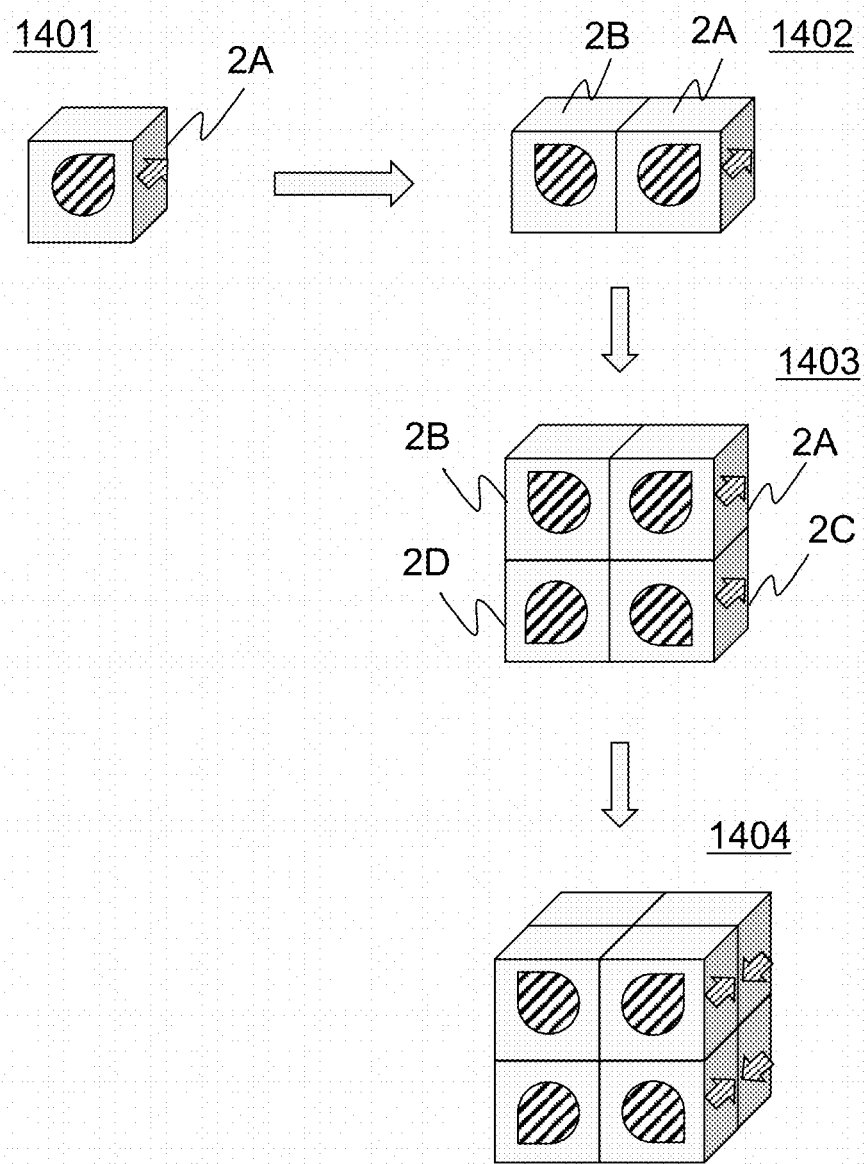
FIG. 14 is a diagram illustrating generation of an expanded image according to a second embodiment.

In the sensitivity distribution calculation step (S1002 in FIG. 3), the sensitivity distribution data (the 3D-Smap data) received in each channel of the receiving coil and the sensitivity distribution data (the 3D-Ref data) received in the body coil are used. At this time, 3D image data after being transformed into the image space is expanded to each axis as illustrated in FIG. 14 to obtain an expanded image. That is, an original image (2A) 1401 is inverted in an x axis direction to obtain a mirror image (2B) symmetrical with respect to a yz plane. Next, an image 1402 obtained by combining the mirror image 2B and the original image 2A is inverted in a y axis direction to obtain a mirror image (2C+2D) symmetrical with respect to an xz plane. An image 1403 obtained by combining the mirror image (2C+2D) and the image 1402 is inverted in a z axis direction to obtain a mirror image 1404 symmetrical with respect to an xy plane. The mirror image 1404 is considered as an expanded image, and the subsequent sensitivity distribution calculation process (S153 to S157 in FIG. 5) is executed.

For the sensitivity distribution calculation, an equation obtained by three-dimensionally expanding each element in the equation (3) may be used, and the frequency component of the sensitivity distribution is calculated in the same manner as in the first embodiment.

Also in the present embodiment, in generation of the expanded image, in the same manner as in the third modification and the fourth modification according to the first embodiment, it is possible to adopt a modification in which the periphery of the original image 1401 is subjected to zero fill, or only the central region of the original image 1401 is inverted and combined, and it is possible to attain the same effects as those according to the third modification and the fourth modification.

Third Embodiment

In the first embodiment and the second embodiment, the sensitivity distribution for each channel is obtained on the premise of the signal separation process (S1003 in FIG. 3) for each channel. In the present embodiment, information corresponding to the sensitivity distribution of each channel is calculated on the premise that parallel imaging according to the GRAPPA method (the method described in Non-Patent Literature 2) is executed as an image generation method.

Figure 15:
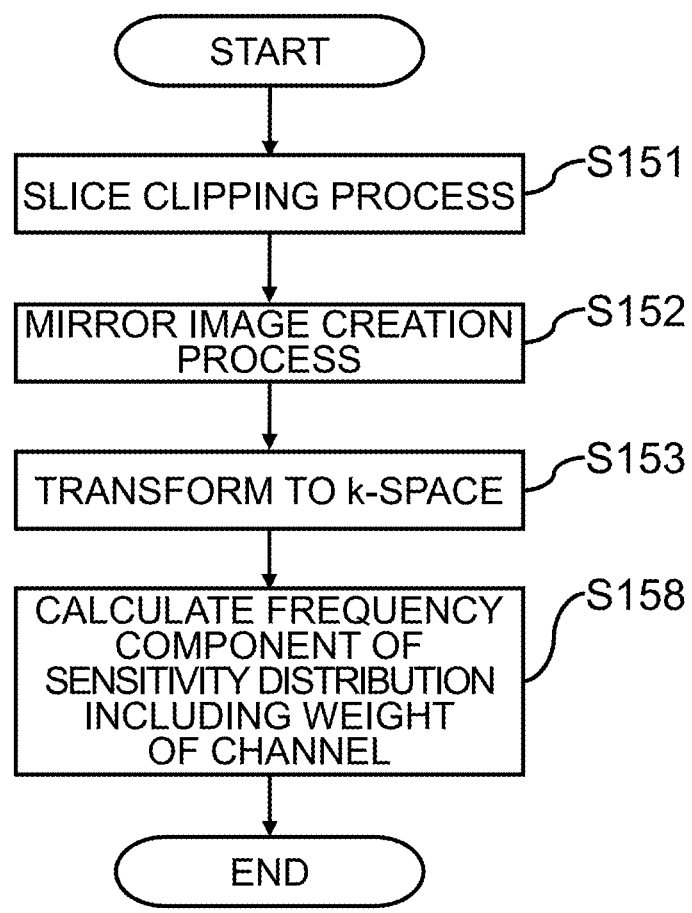
FIG. 15 is a diagram illustrating a process according to a third embodiment.

The process according to the present embodiment will be described by taking the case of 2D imaging as an example. FIG. 15 illustrates a process flow according to the present embodiment. In FIG. 15, the same processes as those in FIG. are illustrated by the same reference numerals. As illustrated in the figure, also in the present embodiment, executing slice clipping from the 3D data obtained in the 3D sensitivity distribution sequence (S151), using the expanded image as described in the first embodiment, the third modification and the fourth modification as the sensitivity distribution data used for calculation (S152), and transforming the loaded image into the k-space data (S153) are the same as those according to the first embodiment.

The GRAPPA method is a method of executing image reconstruction by interpolating non-measurement lines in the k-space on the k-space data subjected to undersampling, and interpolates data of a plurality of measurement lines including other coils by executing weighted addition when the non-measurement lines are interpolated. Weights of the plurality of measurement lines correspond to weights of the channels, and in the present embodiment, weights of data of each of the channels are calculated as information corresponding to the sensitivity distribution (S158).

Specifically, in the calculation of the frequency component of the sensitivity distribution, the weight $c_i'(k, j)$ of an i-th channel with respect to a j-th channel is obtained based on the following equation (8) instead of the equation (2) used in the frequency component calculation S154 according to the first embodiment.

$$S_i'(k) = \Sigma j c_i'(k,j) * S_j'(k) \qquad (8)$$

The weight $c_i'(k, j)$ corresponds to the frequency component (the weight wi in the k-space) of the sensitivity distribution of each channel obtained in the first embodiment. In the first embodiment, the weight wi is subjected to inverse Fourier transform to obtain the sensitivity distribution in the image space. In the present embodiment, $c_i(k, j)$ is used as a weight for the measurement data in the k-space to interpolate the non-measurement lines, and image reconstruction is executed.

The embodiments and the modifications of the MRI device according to the invention are described above, and are merely examples. Alternatively, elements may be added to the illustrated structure or process, or a part of the elements may be omitted.

Figure 16:
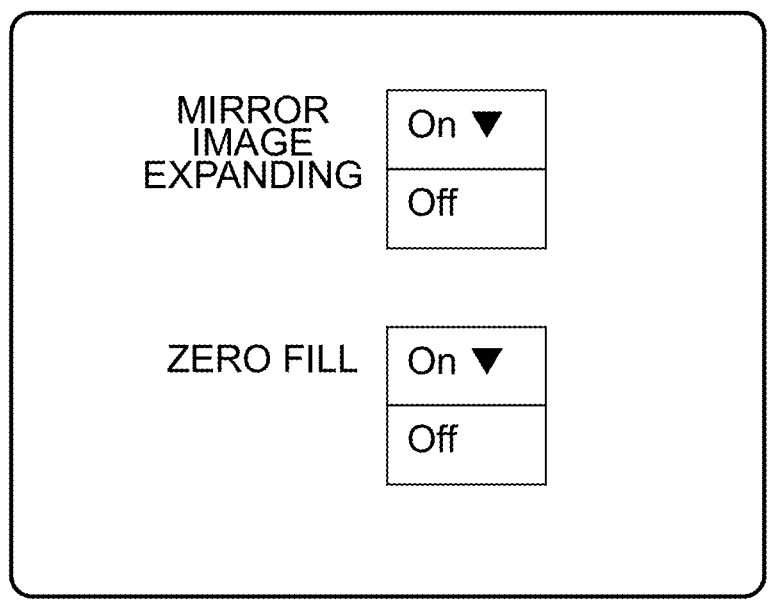
FIG. 16 is a diagram illustrating an example of a user interface.

In the above-mentioned embodiment, although involvement of the user is not particularly mentioned. Alternatively, the user may designate whether to expand the image into a mirror image (the method according to the first embodiment), whether to execute zero fill, or the like (the third modification or the fourth modification) via a user interface as illustrated in FIG. 16.

The embodiments of the invention are described above. However, the function (the sensitivity distribution calculation program) of the sensitivity distribution calculation unit 21 according to these embodiments is not limited to the MRI device, and can be achieved by any device (image processing device) provided with units that enables the sensitivity distribution calculation in a frequency space. Functions achieved by such an image processing device are also included in the invention.

Furthermore, the invention can be applied not only to parallel imaging in which the k-space data is undersampled, but also to parallel imaging according to selection excitation method (SMS) for a plurality of slices and synthesis (MAC synthesis) of a plurality of channel images in the same manner. In general MAC synthesis, phase information disappears due to usage of a sum of squares of the sensitivity distribution. However, by using the sensitivity distribution obtained based on the method according to the present embodiment, an image (a complex image) having the phase information can be obtained.

What is claimed is:

1. A magnetic resonance imaging device comprising:
a measurement unit that is provided with a receiving coil having a plurality of channels and is configured to measure a nuclear magnetic resonance signal of a subject for each channel of the receiving coil; and
an image calculation unit configured to create an image of the subject using a sensitivity distribution for each channel of the receiving coil and a channel image generated based on the nuclear magnetic resonance signal for each channel measured by the measurement unit, wherein
the image calculation unit includes a sensitivity distribution calculation unit configured to calculate a sensitivity distribution for each channel of the receiving coil in a k-space using an image obtained for sensitivity distribution, and
the sensitivity distribution calculation unit includes an expanded image creation unit configured to generate, by executing one or more inversion processes on at least a part of the image for obtaining sensitivity distribution, an expanded image obtained by combining the image for obtaining sensitivity distribution and an inverted image, and calculates the sensitivity distribution using the expanded image.

2. The magnetic resonance imaging device according to claim 1, wherein
the expanded image creation unit is configured to generate, as the inverted image, a mirror image obtained by inverting the entire image.

3. The magnetic resonance imaging device according to claim 1, wherein
the expanded image creation unit is configured to form, as the inverted image, a partial mirror image obtained by inverting a region excluding an end portion region of the image, and connect the partial mirror image to an end of the original image for obtaining sensitivity distribution to generate the expanded image.

4. The magnetic resonance imaging device according to claim 1, wherein
the expanded image creation unit is configured to execute one or more inversion processes after enlarging a periphery of the image for obtaining sensitivity distribution by zero fill.

5. The magnetic resonance imaging device according to claim 1, wherein
the sensitivity distribution calculation unit is configured to calculate the sensitivity distribution using a region in the k-space corresponding to a region of the original image for obtaining sensitivity distribution in the expanded image.

6. The magnetic resonance imaging device according to claim 1, wherein
the image for obtaining sensitivity distribution is a three-dimensional image, and
the sensitivity distribution calculation unit further includes a slice clipping unit configured to clip a two-dimensional image for obtaining sensitivity distribution from the three-dimensional image for obtaining sensitivity distribution, and is configured to calculate the sensitivity distribution for each slice.

7. The magnetic resonance imaging device according to claim 6, wherein
the slice clipping unit is configured to clip the two-dimensional image for obtaining sensitivity distribution so as to provide the same FOV as an FOV of the image of the subject created by the image calculation unit.

8. The magnetic resonance imaging device according to claim 1, wherein
the image for obtaining sensitivity distribution is a three-dimensional image, and
the expanded image creation unit is configured to
execute an inversion process on the three-dimensional image, and
create a three-dimensional expanded image obtained by expanding the three-dimensional image in a three-dimensional direction.

9. The magnetic resonance imaging device according to claim 1, wherein the image for obtaining sensitivity distribution includes a reference image and a channel image generated based on a nuclear magnetic resonance signal for each channel, and the measurement unit further includes, as the receiving coil, a wide-region receiving coil configured to measure a nuclear magnetic resonance signal for the reference image.

10. The magnetic resonance imaging device according to claim 1, wherein the image for obtaining sensitivity distribution includes a reference image and a channel image generated based on a nuclear magnetic resonance signal for each channel, and the image calculation unit further includes an image synthesis unit configured to synthesize the channel image to generate the reference image.

11. The magnetic resonance imaging device according to claim 1, wherein the sensitivity distribution calculation unit is configured to calculate, as the sensitivity distribution, a weight of sensitivity distribution data for each channel with respect to all the channels, and the image calculation unit is configured to execute image reconstruction based on a GRAPPA method using a sensitivity distribution including a weight in the k-space of each channel for the nuclear magnetic resonance signal measured for each channel.

12. A sensitivity distribution calculation program for calculating a sensitivity distribution for each channel of a magnetic resonance imaging device provided with a receiving coil including a plurality of channels by processing a nuclear magnetic resonance signal measured in each channel, the sensitivity distribution calculation program causing a computer to execute steps of reading an image for obtaining sensitivity distribution including a reference image and a channel image, or generating the image for obtaining sensitivity distribution based on a nuclear magnetic resonance signal acquired by the magnetic resonance imaging device, executing one or more inversion processes on at least a part of the image for obtaining sensitivity distribution, and generating an expanded image for each of the reference image and the channel image by combining a generated inverted image and the original image for obtaining sensitivity distribution, executing inverse Fourier transform on the expanded image to generate k-space data, and calculating a sensitivity distribution for each channel based on the expanded image in the k-space.

13. The sensitivity distribution calculation program according to claim 12, wherein the image for obtaining sensitivity distribution is three-dimensional data, and the steps further comprise a step of clipping a two-dimensional image for obtaining sensitivity distribution from the three-dimensional data.

14. The sensitivity distribution calculation program according to claim 12, wherein the step of calculating a sensitivity distribution further includes a step of removing peripheral noise of the sensitivity distribution calculated for each channel.

* * * * *